(12) United States Patent
Morihana

(10) Patent No.: US 10,923,377 B2
(45) Date of Patent: Feb. 16, 2021

(54) LOAD PORT AND METHOD OF DETECTING ABNORMALITY IN FOUP LID OF LOAD PORT

(71) Applicant: Sinfonia Technology Co., Ltd., Tokyo (JP)

(72) Inventor: Toshimitsu Morihana, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 16/592,677

(22) Filed: Oct. 3, 2019

(65) Prior Publication Data

US 2020/0111695 A1   Apr. 9, 2020

(30) Foreign Application Priority Data

Oct. 9, 2018 (JP) .................................. 2018-191020

(51) Int. Cl.
*H01L 21/677* (2006.01)
*H01L 21/67* (2006.01)

(52) U.S. Cl.
CPC .. *H01L 21/67772* (2013.01); *H01L 21/67265* (2013.01); *H01L 21/67775* (2013.01)

(58) Field of Classification Search
CPC ......... H01L 21/67772; H01L 21/67775; H01L 21/67265
See application file for complete search history.

(56) References Cited

U.S. PATENT DOCUMENTS

| 6,984,097 | B1 | 1/2006 | Saeki et al. |
| 9,627,237 | B2* | 4/2017 | Matsumoto ....... H01L 21/67265 |
| 10,424,499 | B2* | 9/2019 | Matsumoto ....... H01L 21/67775 |
| 2004/0099826 | A1* | 5/2004 | Igarashi ................. G01V 8/12 |
| | | | 250/559.29 |
| 2010/0243867 | A1* | 9/2010 | Suzuki ............. H01L 21/67772 |
| | | | 250/215 |
| 2014/0369793 | A1* | 12/2014 | Hall ................. H01L 21/67772 |
| | | | 414/222.02 |
| 2016/0260628 | A1* | 9/2016 | Ochiai ............. H01L 21/67369 |
| 2020/0058531 | A1* | 2/2020 | Matsumoto ....... H01L 21/67772 |

FOREIGN PATENT DOCUMENTS

JP       3954287        3/2001

* cited by examiner

*Primary Examiner* — Kaitlin S Joerger
(74) *Attorney, Agent, or Firm* — Kilpatrick Townsend & Stockton LLP

(57) ABSTRACT

There is provided a load port provided to a loading/unloading port of a semiconductor-processing apparatus to transfer a semiconductor wafer, including: a FOUP support configured to support a FOUP that includes a FOUP lid and move the FOUP in a front-rear direction with respect to the loading/unloading port; a lid configured to open and close the loading/unloading port; a FOUP lid sensor provided to perform a detection operation between a position of the lid in a closed state and a position of the FOUP lid when unloading is normally completed by retreating the FOUP by a predetermined distance with respect to the loading/unloading port; and an observer configured to observe that the FOUP lid sensor has performed the detection operation after the unloading is completed.

2 Claims, 4 Drawing Sheets

LOAD PORT AND METHOD OF DETECTING ABNORMALITY IN FOUP LID OF LOAD PORT

CROSS-REFERENCE TO RELATED APPLICATION

This application is based upon and claims the benefit of priority from Japanese Patent Application No. 2018-191020, filed on Oct. 9, 2018, the entire contents of which are incorporated herein by reference.

TECHNICAL FIELD

The present disclosure relates to a load port and a method of detecting an abnormality in a FOUP (Front Opening Unified Pod) lid of a load port.

BACKGROUND

A load port, which is provided to a loading/unloading port of a semiconductor-processing apparatus and used for transferring a semiconductor wafer, has been widely used (see, for example, Patent Document 1). In a "mini-environment method" that locally forms an area having a high degree of cleanliness, semiconductor wafers are stored in a sealed container called a FOUP kept at a higher degree of cleanliness than the external atmosphere. The load port can load and unload semiconductor wafers to and from the FOUP. Then, the semiconductor wafers stored in the FOUP are transferred to a next process while a clean environment is maintained.

For loading and unloading semiconductor wafers, the FOUP has a FOUP lid that can be opened and closed. Furthermore, the load port includes a FOUP support that supports the FOUP to be movable back and forth with respect to the semiconductor-processing apparatus.

To maintain the clean environment, when the FOUP is closed, the FOUP lid has to be properly attached to a FOUP body and has to be kept in a sealed state. However, an abnormality in which the FOUP lid is not properly attached to the FOUP body may sometimes occur due to, for example, a failure in locking the FOUP lid onto the FOUP body. In this case, when the unloading is completed by retreating the FOUP by a predetermined distance from the semiconductor-processing apparatus, the FOUP lid may, for example, become detached from the FOUP body.

In the conventional load port, various sensors are provided but a means for detecting the detachment of the FOUP lid has not been provided. For this reason, the FOUP may be transferred while the FOUP lid is in a detached state. Thus, the semiconductor wafers may be exposed to an atmosphere having a low degree of cleanliness, or the semiconductor wafers may get out and detach from the FOUP, and may be damaged during the transfer.

In addition, the load port described in Patent Document 1 is configured to detect whether a lid of a wafer carrier (corresponding to a FOUP) containing semiconductor wafers is held on to the body side of the load port (Paragraph 0053 of Patent Document 1). However, this load port does not detect whether or not the lid is properly attached to the wafer carrier after the lid is separated from the body side of the load port and attached to the wafer carrier. For this reason, in the configuration described in Patent Document 1, it is not possible to detect an abnormality in which a FOUP lid is not properly attached to a FOUP body.

PRIOR ART DOCUMENTS

Patent Documents

Patent Document 1: Japanese Patent No. 3954287

SUMMARY

The present disclosure provides a load port and a method of detecting an abnormality in a FOUP lid of a load port, which are capable of detecting the abnormality in which the FOUP lid is not properly attached to a FOUP body.

According to an embodiment of the present disclosure, there is provided a load port provided to a loading/unloading port of a semiconductor-processing apparatus to transfer a semiconductor wafer, the load port including: a FOUP support configured to: support a FOUP that includes a FOUP lid, which is capable of opening and closing, and is a container configured to contain the semiconductor wafer; and move the FOUP in a front-rear direction with respect to the loading/unloading port; a lid configured to open and close the loading/unloading port; a FOUP lid sensor provided to perform a detection operation between a position of the lid in a closed state and a position of the FOUP lid when unloading is normally completed by retreating the FOUP by a predetermined distance with respect to the loading/unloading port; and an observer configured to observe that the FOUP lid sensor has performed the detection operation after the unloading is completed.

According to this configuration, the load port includes the FOUP lid sensor and the observer. Therefore, for example, the FOUP lid detached from the FOUP body can be detected by the FOUP lid sensor, and such detection can be detected by the observer.

In the load port, the FOUP lid sensor may be an optical sensor.

According to this configuration, the optical sensor is used as the FOUP lid sensor. Therefore, for example, the detachment of the FOUP lid from the FOUP body can be easily detected by the blocking of a light beam.

In the load port, the FOUP lid sensor may have an optical axis inclined in the front-rear direction.

According to this configuration, by inclining the optical axis in the front-rear direction, it is possible to widen the detection range in the front-rear direction.

According to another embodiment of the present disclosure, there is provided a method of detecting an abnormality in a FOUP lid of a load port FOUP for use in the load port provided to a loading/unloading port of a semiconductor-processing apparatus to transfer a semiconductor wafer, the load port including: a FOUP support configured to support a FOUP that includes a FOUP lid, which is capable of opening and closing, and is a container configured to contain the semiconductor wafer, and move the FOUP in a front-rear direction with respect to the loading/unloading port; a lid configured to open and close the loading/unloading port; and a FOUP lid sensor provided to perform a detection operation between a position of the lid in a closed state and a position of the FOUP lid when unloading is normally completed by retreating the FOUP by a predetermined distance with respect to the loading/unloading port, wherein the method includes: closing the FOUP lid; retreating the FOUP with respect to the loading/unloading port over the FOUP support; and performing the detection operation by the FOUP lid sensor.

According to this method, after retreating the FOUP with respect to the loading/unloading port, for example, the FOUP lid detached from the FOUP body can be detected by the FOUP lid sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will be described below with reference to the drawings. When describing a front-rear relationship in the following description, a direction towards a semiconductor-processing apparatus provided in contact with a panel portion of a load port will be referred to as a "front direction," and a direction away from the semiconductor-processing apparatus will be referred to as a "rear direction." In addition, a vertical relationship described in the following description corresponds to a vertical relationship shown in FIG. 1.

A load port 1 of the present embodiment is provided to a loading/unloading port (not shown) of a semiconductor-processing apparatus. The semiconductor-processing apparatus is positioned at an upper right side of the load port 1 in FIG. 1 (to an inner side of a lid portion 13 and a panel portion 14). It is assumed that the semiconductor-processing apparatus according to the present embodiment includes a transfer device such as an EFEM (Equipment Front End Module) or the like that transfers a semiconductor wafer to be processed. The load port 1 is connected to this transport device. An inside of the semiconductor-processing apparatus (including the transfer device) is kept at a higher degree of cleanliness than the external atmosphere.

Figure 1:
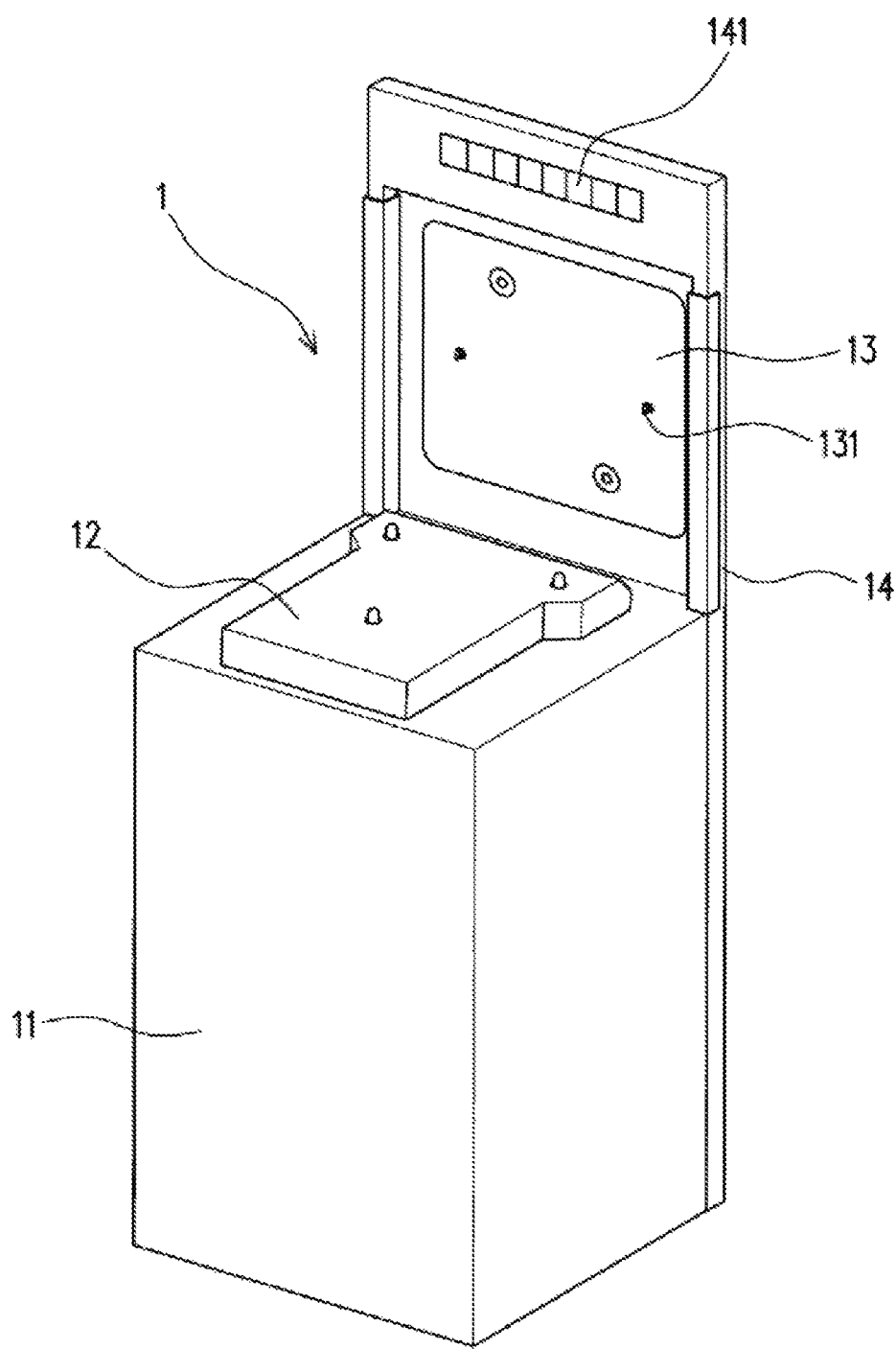
FIG. 1 is a perspective view showing a load port according to an embodiment of the present disclosure.

The load port 1 mainly includes a body portion 11, a FOUP support 12, and a lid portion 13 as shown in FIG. 1. The basic (mechanical) configuration of the load port 1 is the same as the known configuration.

The body portion 11 is a box-shaped portion and is disposed at the rear direction of the semiconductor-processing apparatus. The panel portion 14 is provided to a front side of the body portion 11 that is installed to, for example, fitted into, an opening part of the semiconductor-processing apparatus. The panel portion 14 is provided with, for example, a display part 141 that indicates an operating state of the load port 1.

Figure 2:
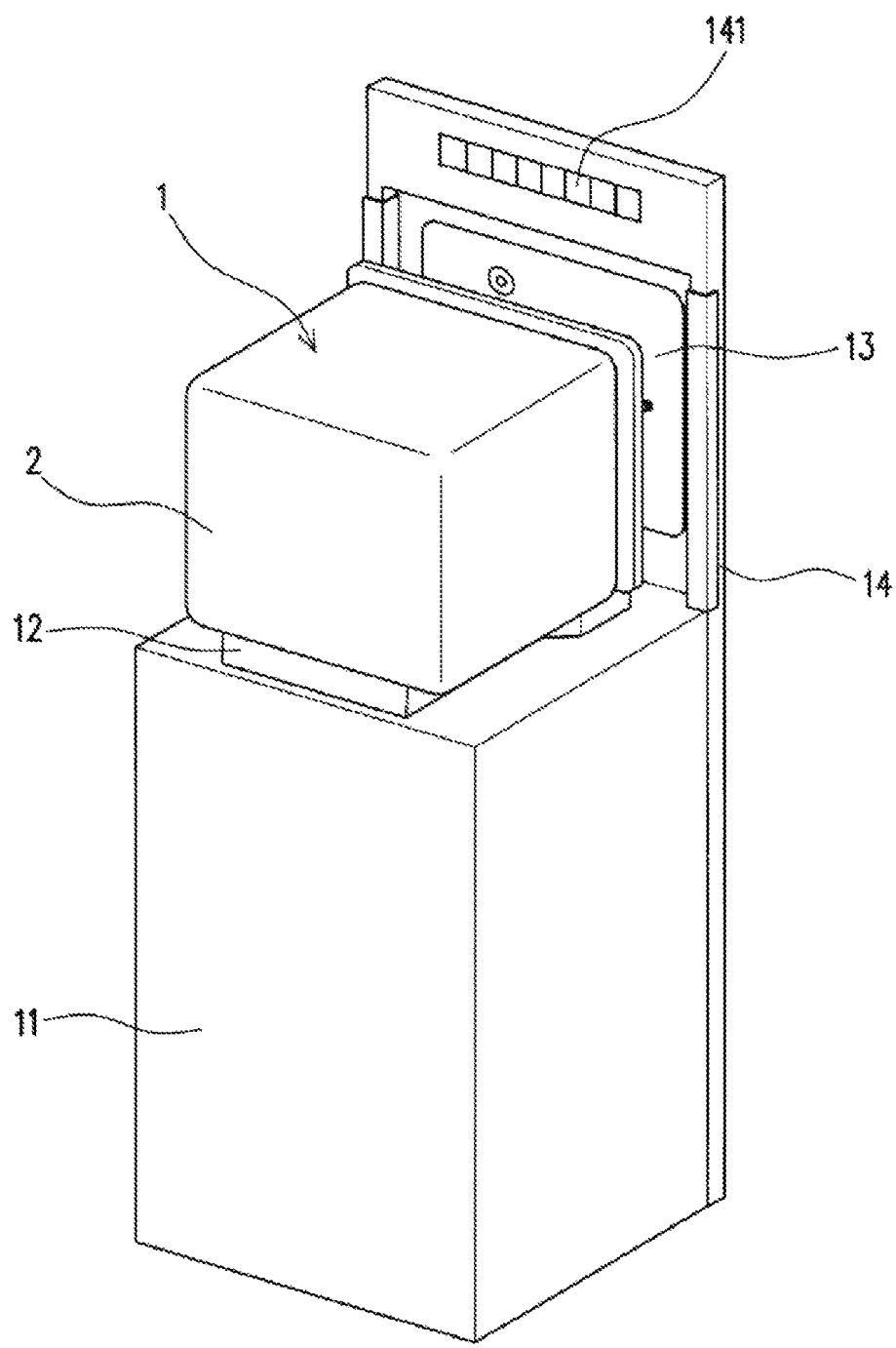
FIG. 2 is a perspective view showing a state in which a FOUP is placed at a FOUP support of the load port.
Figure 3:
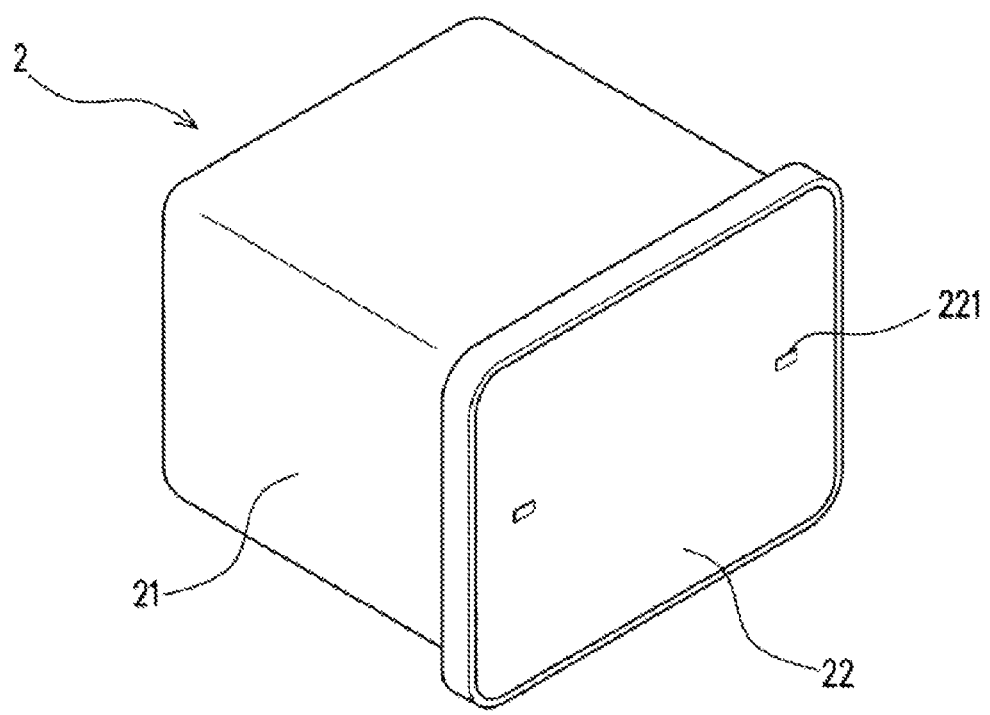
FIG. 3 is a perspective view showing an example of the FOUP used for the load port.

The FOUP support 12 is provided to be movable in the front-rear direction with respect to an upper surface of the body portion 11. As shown in FIG. 2, a FOUP 2 is placed at and fixed to above the FOUP support 12. This enables the FOUP support 12 to support the FOUP 2. Thus, pins or claws for positioning and fixing the FOUP 2 are provided on the upper surface of the FOUP support 12, as schematically shown in FIG. 1. In this regard, the FOUP 2 has, for example, a shape as shown in FIG. 3, and includes a FOUP body 21 having a space therein and a FOUP lid 22 detachably attached to the FOUP body 21 and capable of opening and closing the FOUP 2. The FOUP 2 is a container capable of storing a plurality of semiconductor wafers therein. Although not shown, the FOUP 2 may be provided with an intake port and an exhaust port. In this case, for example, nitrogen purge may be performed inside the FOUP 2 using the intake port and the exhaust port. The FOUP 2 is placed over the FOUP support 12 so that the FOUP lid 22 faces the semiconductor-processing apparatus (see FIG. 2). The state shown in FIG. 2 is a state in which the FOUP lid 22 of the FOUP 2 is separated in the rear direction from the lid portion 13 of the load port 1. Furthermore, when the FOUP 2 is advanced by the FOUP support 12, a contact portion around an opening of the FOUP body 21 makes an airtight contact with the panel portion 14. Thus, the semiconductor wafers can be transferred between the semiconductor-processing apparatus and the FOUP 2 in an environment having a high degree of cleanliness.

The lid portion 13 is a plate-shaped portion capable of opening and closing the loading/unloading port (a part of the opening part) provided for loading and unloading a semiconductor wafer in the semiconductor-processing apparatus. In the present embodiment, as shown in FIG. 1, the lid portion 13 has a substantially rectangular shape. The lid portion 13 is provided to be movable (e.g., vertically movable) with respect to the panel portion 14. For example, the lid portion 13 can airtightly close the loading/unloading port when moved upward and can open the loading/unloading port when moved downward. At the time of the downward movement, in order not to interfere with the panel portion 14, the lid portion 13 is first advanced (moved toward the semiconductor-processing apparatus) and then moved downward along the panel portion 14. A fitting portion (latch mechanism or the like) 131 to be fitted to the FOUP lid 22 is provided on a surface of the lid portion 13 facing the FOUP 2. The FOUP lid 22 is provided with a fitted portion 221 to correspond to the fitting portion 131. The FOUP 2 is advanced on the FOUP support 12 so that the FOUP lid 22 is laid over the lid portion 13, whereby the fitting portion 131 of the lid portion 13 and the fitted portion 221 of the FOUP lid 22 are brought into a fitted state. Thus, the FOUP lid 22 and the lid portion 13 are integrated. By moving the lid portion 13 with respect to the panel portion 14 in this state, the FOUP lid 22 can be detached from the FOUP body 21, and the lid portion 13 can be opened with respect to the loading/unloading port of the semiconductor-processing apparatus. In this state, the loading/unloading port and an inside of the FOUP body 21 are in communication with each other, and thus a semiconductor wafer can be loaded and unloaded to and from the FOUP body 21, for example, by using a robot arm provided inside the EFEM.

The load port 1 is provided with various sensors. Particularly, in the present embodiment, a FOUP lid sensor 15 is provided. The FOUP lid sensor 15 is provided to perform a detection operation between a position of the lid portion 13 in a closed state and a position of the FOUP lid 22 when unloading is normally completed by retreating the FOUP 2 by a predetermined distance with respect to the loading/unloading port of the semiconductor-processing apparatus (in other words, when undocking is completed by detaching the FOUP 2 from the loading/unloading port). With respect to the detection operation of the FOUP lid sensor 15, an observing part (not shown) is provided for observing that the FOUP lid sensor 15 has performed the detection operation after the unloading is completed. The observing part may be provided in a controller (or any suitable type of a processor) of the load port 1.

Figure 4:
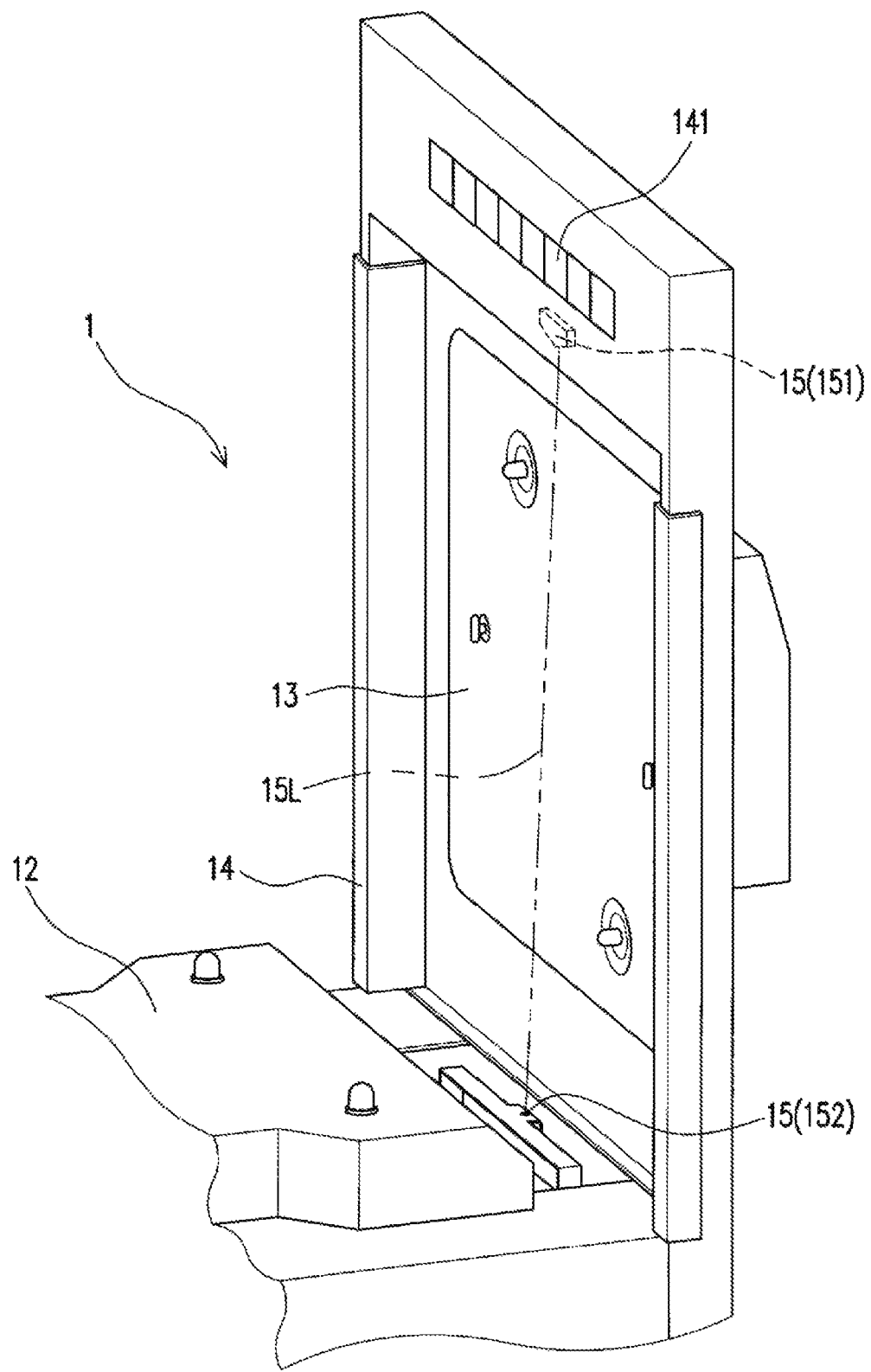
FIG. 4 is a partially enlarged perspective view showing a FOUP lid sensor and its optical axis in the load port.

In the present embodiment, an optical sensor is used as the FOUP lid sensor 15. As shown in FIG. 4, a light-emitting part 151 of the FOUP lid sensor 15 is provided at the panel portion 14, and a light-receiving part 152 of the FOUP lid sensor 15 is provided at a top of the body portion 11, more specifically, in front of the FOUP support 12 that has been retreated as the unloading is completed. The light for detection is projected from above to below. An optical axis 15L (indicated by a two-dot chain line) of the FOUP lid sensor 15 is inclined in the front-rear direction. Specifically, as shown in FIG. 4, the lower light-receiving part 152 is positioned in the rear direction of the upper light-emitting part 151 (toward away from the lid portion 13). That is, the optical axis 15L is inclined with respect to a surface direction of the FOUP lid 22 (i.e., the vertical direction). By providing the optical axis 15L in an inclined manner as described above, a detection range in the front-rear direction can be made wider than when the optical axis is parallel to the surface direction of the FOUP lid 22. For this reason, it is possible to improve the reliability of detection when the FOUP lid 22 is detached from the FOUP body 21.

Next, a method of detecting an abnormality in the FOUP lid 22 of the load port 1 according to the present embodiment will be described. When detecting, a step of closing the FOUP lid 22 is performed first. Then, a step of retreating the FOUP 2 together with the FOUP support 12 with respect to the loading/unloading port of the semiconductor-processing apparatus is performed over the FOUP support 12. Subsequently, when the retreating operation of the FOUP 2 in the load port 1 is determined to be normally completed by detection of another sensor or the like, the FOUP lid sensor 15 then performs a detection operation. When detection by the FOUP lid sensor 15 (in the present embodiment, when the light beam emitted from the light-emitting part 151 to the light-receiving part 152 is blocked) may imply that a foreign object is present at a position where there should be nothing in a normal state. The foreign object is highly likely to be the FOUP lid 22 detached from the FOUP body 21. Therefore, it is possible to detect an abnormality in which the FOUP lid 22 is not properly attached to the FOUP body 21.

Although one embodiment of the present disclosure has been described above, the present disclosure is not limited to the above-described embodiment but may be variously modified without departing from the gist of the present disclosure.

The abnormality in which the FOUP lid 22 is not properly attached to the FOUP body 21, which is the detection target in the above-described embodiment, is detachment of the FOUP lid 22 from the FOUP body 21, i.e., the state in which the FOUP lid 22 is completely detached. However, the present disclosure is not limited thereto. For example, displacement of the FOUP lid 22 from the FOUP body 21, i.e., incomplete detachment of the FOUP lid 22, may be the detection target as long as it occurs at a position where the FOUP lid sensor 15 can detect the detection target. The FOUP lid sensor 15 can also detect foreign objects other than the FOUP lid 22.

Moreover, although the optical sensor is used as the FOUP lid sensor 15 in the above-described embodiment, the present disclosure is not limited thereto. Other types of sensors such as a contact-type sensor and the like may also be used. When the optical sensor is used, the direction of the optical axis 15L is not limited to the vertical direction as in the above-described embodiment but may be horizontal or diagonal. In addition, although one FOUP lid sensor 15 is provided for one load port 1 in the above-described embodiment, a plurality of FOUP lid sensors 15 may be provided.

According to the present disclosure in some embodiments, it is possible to detect an abnormality in which a FOUP lid is not properly attached to a FOUP body.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A load port provided to a loading/unloading port of a semiconductor-processing apparatus to transfer a semiconductor wafer, the load port comprising:
    a FOUP (Front Opening Unified Pod) support configured to:
        support a FOUP that includes a FOUP lid, which is capable of opening and closing, and is a container configured to contain the semiconductor wafer; and
        move the FOUP in a front-rear direction with respect to the loading/unloading port;
    a lid configured to open and close the loading/unloading port;
    a FOUP lid sensor, which is an optical sensor having an optical axis inclined in the front-rear direction and is provided to perform a detection operation between a position of the lid in a closed state and a position of the FOUP lid when unloading is normally completed by retreating the FOUP by a predetermined distance with respect to the loading/unloading port; and
    an observer configured to observe that the FOUP lid sensor has performed the detection operation after the unloading is completed.

2. A method of detecting an abnormality in a FOUP (Front Opening Unified Pod) lid of a load port for use in the load port provided to a loading/unloading port of a semiconductor-processing apparatus to transfer a semiconductor wafer, the load port comprising: a FOUP support configured to support a FOUP that includes a FOUP lid, which is capable of opening and closing, and is a container configured to contain the semiconductor wafer, and move the FOUP in a front-rear direction with respect to the loading/unloading port; a lid configured to open and close the loading/unloading port; and a FOUP lid sensor, which is an optical sensor having an optical axis inclined in the front-rear direction and is provided to perform a detection operation between a position of the lid in a closed state and a position of the FOUP lid when unloading is normally completed by retreating the FOUP by a predetermined distance with respect to the loading/unloading port, wherein the method comprises:
closing the FOUP lid;
retreating the FOUP with respect to the loading/unloading port over the FOUP support; and
performing the detection operation by the FOUP lid sensor.

* * * * *